(12) United States Patent
Jang et al.

(10) Patent No.: US 11,056,414 B2
(45) Date of Patent: Jul. 6, 2021

(54) SEMICONDUCTOR PACKAGE

(71) Applicant: SAMSUNG ELECTRONICS CO., LTD., Suwon-si (KR)

(72) Inventors: Ae-Nee Jang, Seoul (KR); Seung-Duk Baek, Hwaseong-si (KR); Tae-Heon Kim, Asan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 74 days.

(21) Appl. No.: 16/507,974

(22) Filed: Jul. 10, 2019

(65) Prior Publication Data

US 2020/0126882 A1 Apr. 23, 2020

(30) Foreign Application Priority Data

Oct. 22, 2018 (KR) .................. 10-2018-0125678

(51) Int. Cl.
| | |
|---|---|
| H01L 23/34 | (2006.01) |
| H01L 23/367 | (2006.01) |
| H01L 23/31 | (2006.01) |
| H01L 23/48 | (2006.01) |
| H01L 23/373 | (2006.01) |
| H01L 23/498 | (2006.01) |
| H01L 23/538 | (2006.01) |

(52) U.S. Cl.
CPC ........ *H01L 23/367* (2013.01); *H01L 23/3157* (2013.01); *H01L 23/3738* (2013.01); *H01L 23/481* (2013.01); *H01L 23/49816* (2013.01); *H01L 23/49827* (2013.01); *H01L 23/5384* (2013.01)

(58) Field of Classification Search
CPC ............. H01L 23/3128; H01L 23/3157; H01L 23/3738; H01L 23/481; H01L 23/49816; H01L 23/49827; H01L 23/5384; H01L 23/5385; H01L 25/0655; H01L 25/18
USPC ......................................................... 257/712
See application file for complete search history.

(56) References Cited

U.S. PATENT DOCUMENTS

| | | | |
|---|---|---|---|
| 6,650,009 | B2 | 11/2003 | Her et al. |
| 7,250,676 | B2 | 7/2007 | Wang |
| 7,361,995 | B2 | 4/2008 | Goh et al. |

(Continued)

FOREIGN PATENT DOCUMENTS

| | | | |
|---|---|---|---|
| JP | 20080305838 | A | 12/2008 |
| JP | 20150146385 | A | 8/2015 |

OTHER PUBLICATIONS

US 8,946,887 B1, 02/2015, Hung et al. (withdrawn)

*Primary Examiner* — Theresa T Doan
(74) *Attorney, Agent, or Firm* — Volentine, Whitt & Francos, PLLC

(57) ABSTRACT

A semiconductor package may include a package substrate, an interposer, a logic chip, at least one memory chip and a heat sink. The interposer may be located over an upper surface of the package substrate. The interposer may be electrically connected with the package substrate. The logic chip may be located over an upper surface of the interposer. The logic chip may be electrically connected with the interposer. The memory chip may be located over an upper surface of the interposer. The memory chip may be electrically connected with the interposer and the logic chip. The heat sink may make thermal contact with the upper surface of the logic chip to dissipate heat in the logic chip.

19 Claims, 3 Drawing Sheets

(56) References Cited

U.S. PATENT DOCUMENTS

| | | | |
|---|---|---|---|
| 7,649,253 B2 | 1/2010 | Sato | |
| 7,858,441 B2 | 12/2010 | Lin et al. | |
| 7,944,049 B2 | 5/2011 | Fujii | |
| 7,973,398 B2 | 7/2011 | Hsu | |
| 8,193,604 B2 | 6/2012 | Lin et al. | |
| 8,780,561 B2 | 7/2014 | Danello et al. | |
| 8,952,533 B2 | 2/2015 | Mohammed et al. | |
| 9,299,678 B2 | 3/2016 | Kyozuka et al. | |
| 9,520,304 B2 | 12/2016 | Chang et al. | |
| 9,595,506 B2 | 3/2017 | Chen et al. | |
| 2006/0087033 A1* | 4/2006 | Goh | H01L 23/3128 257/737 |
| 2006/0278975 A1* | 12/2006 | Tsao | H01L 23/3128 257/720 |
| 2016/0133602 A1* | 5/2016 | Chen | H01L 23/3737 257/712 |
| 2016/0372398 A1 | 12/2016 | Kourakata et al. | |

* cited by examiner

SEMICONDUCTOR PACKAGE

CROSS-REFERENCE TO RELATED APPLICATION

A claim of priority under 35 USC § 119 is made to Korean Patent Application No. 10-2018-0125678, filed Oct. 22, 2018, in the Korean Intellectual Property Office (KIPO), the disclosure of which is herein incorporated by reference in its entirety.

BACKGROUND

Example embodiments relate to a semiconductor package. More particularly, example embodiments relate to a system-in package including memory chips and a logic chip.

A system in package (SiP or system-in-a-package) generally includes multiple integrated circuits included in a same chip carrier package. For example, the system in package may include a plurality of memory chips and a logic chip mounted within a same chip carrier package. In this case, the memory chips and the logic chip may be electrically connected to each other via an interposer located between the chips and a system substrate of the system in package. Separately, the chips of the system in package may have differing thicknesses. For example, one or more memory chips may have a multi-chip structure of stacked memory chips. Thus, these multi-chip memory chips may have a thickness that may be greater than that of the logic chip.

SUMMARY

According to example embodiments, a semiconductor package may include a package substrate, an interposer located over an upper surface of the package substrate and electrically connected to the package substrate, a logic chip located over an upper surface of the interposer and electrically connected to the interposer, a memory chip located over the upper surface of the interposer and electrically connected to the interposer and to the logic chip, and a heat sink in thermal contact with an upper surface of the logic chip to dissipate heat in the logic chip.

According to example embodiments, a semiconductor package may include a package substrate, an interposer located over an upper surface of the package substrate and electrically connected with the package substrate, a logic chip located over an upper surface of the interposer and electrically connected with the interposer, and a memory chip located over the upper surface of the interposer and electrically connected with the interposer and the logic chip, where the memory chip has an upper surface that is higher than an upper surface of the logic chip. The semiconductor package may further include a heat sink making thermal contact with the upper surface of the logic chip to dissipate heat in the logic chip, the heat sink having an upper surface that is coplanar with the upper surface of the memory chip, and a main heat sink making contact with the upper surfaces of the memory chip and the heat sink to dissipate heat in the memory chip and the heat sink.

According to example embodiments, a semiconductor package may include a package substrate, an interposer located over an upper surface of the package substrate and electrically connected with the package substrate, a logic chip located over an upper surface of the interposer and electrically connected with the interposer, a memory chip located over the upper surface of the interposer and electrically connected with the interposer and the logic chip, where the memory chip has an upper surface that may be higher than an upper surface of the logic chip. The semiconductor package may further included a main heat sink including a first lower surface making thermal contact with the upper surface of the memory chip, and a second lower surface of a heat-transferring portion extended from the lower surface and making thermal contact with the upper surface of the logic chip to dissipate heat in the memory chip and the logic chip.

BRIEF DESCRIPTION OF THE DRAWINGS

Example embodiments will be more clearly understood from the detailed description that follows taken in conjunction with the accompanying drawings.

FIG. 1 is a cross-sectional view illustrating a semiconductor package in accordance with example embodiments;

FIG. 2 is a schematic plan view illustrating the semiconductor package in FIG. 1;

FIG. 3 is a schematic plan view illustrating an interposer with chips mounted thereon of the semiconductor package in FIG. 1;

FIG. 4 is a cross-sectional view illustrating a semiconductor package in accordance with other example embodiments; and FIG. 5 is a cross-sectional view illustrating a semiconductor package in accordance with still other example embodiments.

DETAILED DESCRIPTION OF THE EMBODIMENTS

Hereinafter, example embodiments will be explained in detail with reference to the accompanying drawings.

Figure 1:
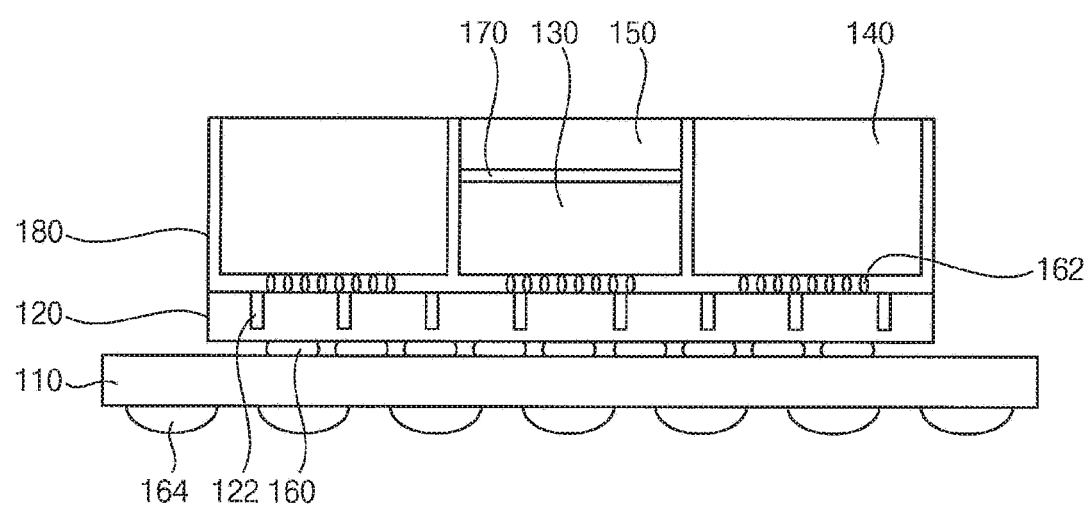
FIGS. 1 to 5 represent non-limiting, example embodiments as described herein.
Figure 2:
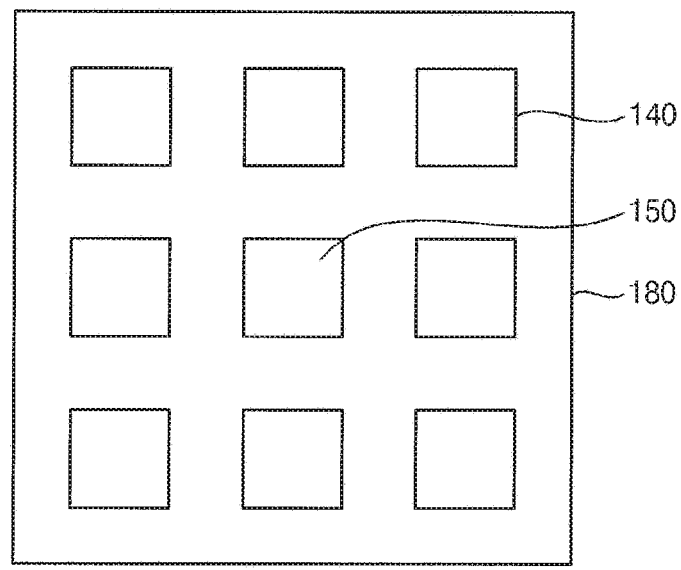
Figure 3:
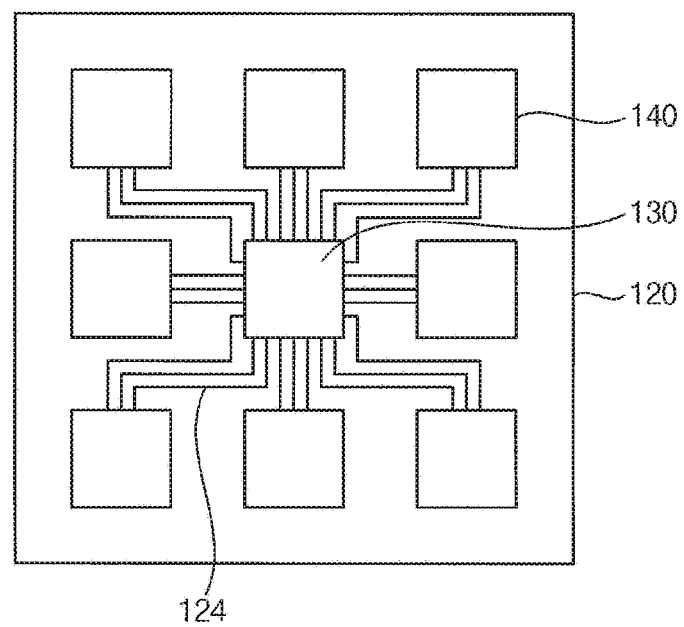

FIG. 1 is a cross-sectional view illustrating a semiconductor package in accordance with example embodiments, FIG. 2 is a schematic plan view of the semiconductor package illustrated in FIG. 1, and FIG. 3 is a schematic plan view of an interposer having chips mounted thereon of the semiconductor package illustrated in FIG. 1. It is noted that the drawings are schematic representations only, and that the illustrated relative dimensions of FIG. 1 differ from those of FIGS. 2 and 3.

In the example of the embodiment of FIG. 1, a semiconductor package includes a package substrate 110, an interposer 120, a logic chip 130, a plurality of memory chips 140, a heat sink 150 and an encapsulating member 180. The semiconductor package may, for example, be a system in package (SiP).

The package substrate 110 may include conductive lines (not shown). Each of the conductive lines may include a conductive trace extending along an upper and/or lower surface of the package substrate 110, and/or a conductive via extending between the upper and lower surfaces of the package substrate 110. However, the embodiments may not be limited to any particular configuration of conductive lines of the package substrate 110. Further, each of the conductive lines may have opposite ends terminating at external terminals 160 and 164. The external terminals 160 may, for example, be solder balls or bumps located between the interposer 120 and the package substrate 110. The external terminals 164 may, for example, be solder balls or bumps located on the lower surface of the package substrate 110.

Again, however, the embodiments may not be limited to any particular configuration of the external terminals 160 and 164.

In the example of FIGS. 1 to 3, the interposer 120 may be arranged over the upper surface of the package substrate 110.

The interposer 120 may include an insulating substrate, a plurality of connecting vias 122 (shown in FIG. 1 only) and a plurality of conductive patterns 124 (shown in FIG. 3 only). The connecting vias 122 may vertically extend through the insulating substrate such that an upper end may be exposed at an upper surface of the interposer 120, and a lower end may be exposed at a lower surface of the interposer 120. The lower ends of the connecting vias 122 may be electrically connected with the conductive lines in the package substrate 110 through the external terminals 160. In this way, the package substrate 110 and the interposer 120 may be electrically connected with each other via the external terminals 160. As shown in FIG. 3, the conductive patterns 124 may be arranged on the upper surface of the interposer 120.

The logic chip 130 may be arranged on the upper surface of the interposer 120. In example embodiments, the logic chip 130 may be arranged on a central portion of the upper surface of the interposer 120. Pads may be arranged on a lower surface of the logic chip 130. Thus, the lower surface of the logic chip 130 may correspond to an active face of the logic chip 130. The logic chip 130 may be electrically connected with the interposer 120 through conductive bumps 162. That is, the pads of the logic chip 130 may be electrically connected with the upper ends of the connecting vias 122 in the interposer 120 via the conductive bumps 162.

Referring to FIGS. 1 and 3, the memory chips 140 may be arranged on the upper surface of the interposer 120. Each of the memory chips 140 may include pads. The pads may be arranged on a lower surface of each of the memory chips 140. Thus, the lower surface of the memory chip 140 may correspond to an active face of the memory chip 140. The memory chips 140 may be electrically connected with the interposer 120 through the conductive bumps 162. That is, the pads of the memory chips 140 may be electrically connected with the upper ends of the connecting vias 122 in the interposer 120 via the conductive bumps 162. In example embodiments, at least one of memory chips 140 may include a high bandwidth memory (HBM) chip.

In example embodiments, the memory chips 140 may be arranged to surround the logic chip 130. The memory chips 140 may be electrically connected with the logic chip 130 through the conductive patterns 124 on the upper surface of the interposer 120.

Further, one or more of the memory chips 140 may have a multi-chip structure in which two or more memory chips are vertically stacked relative to the horizontal surface of the package substrate 110. The number of stacked chips of each of the memory chips 140 may not be limited and may be four, eight, twelve, sixteen, etc. The multi-chip structure of the memory chips 140 may have a thickness which may be greater than that of the logic chip 130. Therefore, the upper surface of the logic chip 130 may be positioned on a plane lower than that on which an upper surface of the memory chip 140 may be positioned.

The heat sink 150 may be arranged on the upper surface of the logic chip 130. The heat sink 150 may make thermal contact with the upper surface of the logic chip 130 to dissipate heat generated from the logic chip 130. The heat sink 150 may have a width which may be substantially the same as that of the logic chip 130. The heat sink 150 may have a length which may be substantially the same as that of the logic chip 130. Thus, the heat sink 150 may have side surfaces coplanar with those of the logic chip 130.

In example embodiments, the heat sink 150 may have an upper surface coplanar with that of the memory chips 140. Because the upper surface of the heat sink 150 may be coplanar with the upper surface of the memory chips 140, a structure may be readily formed over the memory chips 140 by following processes. For example, as is described in a subsequent embodiment, a main heat sink for dissipating heat in the memory chips 140 may be easily arranged on the upper surfaces of the memory chips 140. A thickness of the heat sink 150 may be determined in accordance with a thickness of the stacked memory chips 140. Alternatively, the upper surface of the heat sink 150 may be higher or lower than that of the memory chips 140.

The heat sink 150 may be a dummy chip. For example, a dummy chip determined to be defective in semiconductor fabrication processes may be used as the heat sink 150. Thus, the heat sink 150 may include silicon of the dummy chip.

The heat sink 150 may be attached to the upper surface of the logic chip 130 using a heat-transferring adhesive 170. The heat-transferring adhesive 170 may function to transfer the heat in the logic chip 130 to the heat sink 150. In example embodiments, the heat-transferring adhesive 170 may include a thermal interface material (TIM).

The encapsulating member 180 may, for example, be formed by supplying an encapsulant into a mold containing the semiconductor package. The encapsulating member 180 may be arranged in a space between the upper surface of the interpose 120 and the lower surfaces of the memory chips 140, a space between inner side surfaces of the memory chips 140 and outer side surfaces of the logic chip 130 and the heat sink 150, and on outer side surfaces of the memory chips 140. The encapsulating member 180 may have an upper surface coplanar with the upper surfaces of the memory chips 140 and the heat sink 150.

Figure 4:
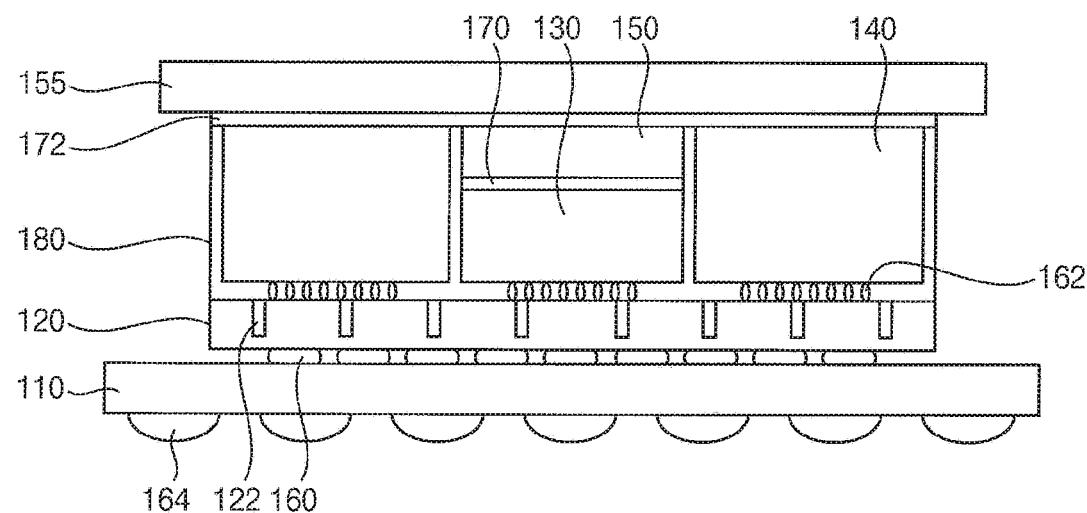

FIG. 4 is a cross-sectional view illustrating a semiconductor package in accordance with example embodiments.

In the example of the embodiment of FIG. 4, a semiconductor package may include a package substrate 110, an interposer 120, a logic chip 130, a plurality of memory chips 140, a heat sink 150, a main heat sink 155 and an encapsulating member 180.

The package substrate 110, the interposer 120, the logic chip 130, the memory chips 140, the heat sink 150 and the encapsulating member 180 of FIG. 4 may be the same or substantially the same as those of FIGS. 1-3 described previously. As such, a detailed description of such elements is omitted here to avoid redundancy.

The example of FIG. 4 differs from that of FIGS. 1-3 by the additional provision of a main heat sink 155.

Referring to FIG. 4, the main heat sink 155 may be arranged on the upper surfaces of the memory chips 140 and the heat sink 150. The main heat sink 155 may dissipate the heat in the memory chips 140 and the heat in the heat sink 150. That is, the main heat sink 155 may directly dissipate the heat in the memory chips 140. Further, the main heat sink 155 may indirectly dissipate the heat in the logic chip 130 through the heat sink 150.

In example embodiments, the main heat sink 155 may have a flat lower surface. As mentioned above, because the upper surfaces of the heat sink 150 and the memory chips 140 may be coplanar with each other, a contact area between the flat lower surface of the main heat sink 155 and the upper surfaces of the heat sink 150 and the memory chips 140 may be expanded. Therefore, heat transfer ratio from the heat sink 150 and the memory chips 140 to the main heat sink 155 may be enhanced.

The main heat sink 155 may be attached to the upper surfaces of the memory chips 140 and the heat sink 150 using a heat-transferring adhesive 172. The heat-transferring adhesive 172 may transfer the heat in the memory chips 140 and the heat sink 150 to the main heat sink 155. In example embodiments, the heat-transferring adhesive 172 may include a thermal interface material (TIM).

In example embodiments, the main heat sink 155 may have an outer side surface coplanar with the outer side surface of the encapsulating member 180. Alternatively, the outer side surface of the main heat sink 155 may be horizontally protruded from the outer side surface of the encapsulating member 180 as in the example shown in FIG. 4. Further, the main heat sink 155 may include a metal. Alternatively, the main heat sink 155 may include silicon.

Figure 5:
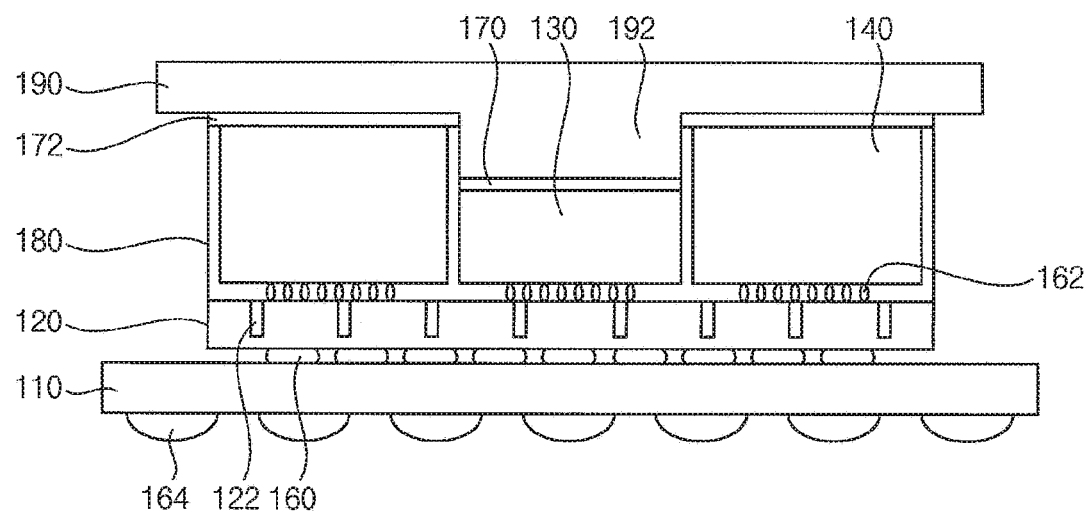

FIG. 5 is a cross-sectional view illustrating a semiconductor package in accordance with example embodiments.

In the example of the embodiment of FIG. 5, a semiconductor package may include a package substrate 110, an interposer 120, a logic chip 130, a plurality of memory chips 140, an integrated heat sink 190 and an encapsulating member 180.

The package substrate 110, the interposer 120, the logic chip 130, the memory chips 140 and the encapsulating member 180 of FIG. 5 may be the same or substantially the same as those of FIGS. 1-3 described previously. As such, a detailed description of such elements is omitted here to avoid redundancy.

The example of FIG. 5 differs from that of FIG. 4 in that the heat sink 150 and the main heat sink 155 of FIG. 4 are replaced with the integrated heat sink 190 of FIG. 5. As shown in FIG. 5, the integrated heat sink 190 may be a one-piece heat sink located over the upper surfaces of the memory chips 140, with a heat-transferring portion 192 centrally located and protruding downwardly over the upper surface of the logic chip 130. That is, as in the example of FIG. 5, the integrated heat sink 190 may have a first lower surface configured to make thermal contact with the upper surfaces of the memory chips 140 using the heat-transferring adhesive 172, and a second lower surface of the heat-transferring portion 192 surrounded by and lower than the first lower surface and configured to make thermal contact with the upper surface of the logic chip 130 using the heat-transferring adhesive 172. The integrated heat sink 190 may, as examples, be formed of a metal or silicon.

In the example of FIG. 5, heat generated in the logic chip 130 may be dissipated through the central lower flat surface (i.e., the lower surface of the heat-transferring portion 192) of the integrated heat sink 190, and heat generated in the memory chips 140 may be dissipated through the outer lower flat surface of the integrated heat sink 190.

According to example embodiments, the heat sink may make contact with the upper surface of the logic chip to effectively dissipate the heat in the logic chip through the heat sink. Further, the upper surface of the heat sink may be coplanar with the upper surface of the memory chip to expand a contact area between the main heat sink and the memory chip, and between the main heat sink and the upper surface of the heat sink. As a result, the heat in the logic chip and the memory chip may be effectively dissipated through the main heat sink.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor package comprising:
    a package substrate;
    an interposer located over an upper surface of the package substrate and electrically connected to the package substrate;
    a logic chip located over an upper surface of the interposer and electrically connected to the interposer;
    a memory chip located over the upper surface of the interposer and electrically connected to the interposer and to the logic chip; and
    a heat sink in thermal contact with an upper surface of the logic chip to dissipate heat in the logic chip,
    wherein the heat sink has an upper surface coplanar with an upper surface of the memory chip.

2. The semiconductor package of claim 1, wherein the heat sink comprises a dummy chip.

3. The semiconductor package of claim 2, wherein the dummy chip comprises silicon.

4. The semiconductor package of claim 1, further comprising a heat-transferring adhesive interposed between the logic chip and the heat sink.

5. The semiconductor package of claim 1, further comprising a main heat sink making thermal contact with an upper surface of the memory chip and an upper surface of the heat sink to dissipate heat in the memory chip and the heat sink.

6. The semiconductor package of claim 5, further comprising a heat-transferring adhesive interposed between the main heat sink and the upper surface of the memory chip, and between the main heat sink and the upper surface of the heat sink.

7. The semiconductor package of claim 1, wherein the memory chip has a thickness that is greater than a thickness of the logic chip and an upper surface that is higher than the upper surface of the logic chip.

8. The semiconductor package of claim 1, wherein the memory chip comprises a plurality of memory chips surrounding the logic chip.

9. The semiconductor package of claim 8, wherein at least one of the memory chips has a multi-chip structure including vertically stacked memory chips.

10. The semiconductor package of claim 1, wherein the interposer comprises:
    an insulating substrate;
    a plurality of connecting vias vertically arranged in the insulating substrate and electrically connected with the package substrate; and
    a plurality of conductive patterns arranged on an upper surface of the insulating substrate to electrically connect the memory chip with the logic chip.

11. The semiconductor package of claim 10, further comprising conductive bumps located between the connecting vias and the memory chip, and between the connecting vias and the logic chip.

12. The semiconductor package of claim 10, further comprising conductive bumps located between the connecting vias and the package substrate.

13. The semiconductor package of claim 1, further comprising an encapsulating member arranged in a space between the interposer and the memory chip, a space between the memory chip and the logic chip, a space between the memory chip and the heat sink, and on an outer side surface of the memory chip.

14. The semiconductor package of claim 1, further comprising external terminals mounted on a lower surface of the package substrate.

15. A semiconductor package comprising:
a package substrate;
an interposer located over an upper surface of the package substrate and electrically connected with the package substrate;
a logic chip located over an upper surface of the interposer and electrically connected with the interposer;
a memory chip located over the upper surface of the interposer and electrically connected with the interposer and the logic chip, the memory chip having an upper surface that is higher than an upper surface of the logic chip;
a heat sink making thermal contact with the upper surface of the logic chip to dissipate heat in the logic chip, the heat sink having an upper surface that is coplanar with the upper surface of the memory chip; and
a main heat sink directly making thermal contact with the upper surfaces of the memory chip and the heat sink to dissipate heat in the memory chip and the heat sink.

16. The semiconductor package of claim 15, further comprising a heat-transferring adhesive interposed between and directly contacting the main heat sink and the memory chip, and interposed between and directly contacting the main heat sink and the heat sink.

17. The semiconductor package of claim 15, wherein the memory chip comprises a plurality of memory chips surrounding the logic chip.

18. The semiconductor package of claim 15, wherein the interposer comprises:
an insulating substrate;
a plurality of connecting vias vertically arranged in the insulating substrate and electrically connected with the package substrate; and
a plurality of conductive patterns arranged on an upper surface of the insulating substrate to electrically connect the memory chip with the logic chip.

19. The semiconductor package of claim 15, further comprising:
an encapsulating member arranged in a space between the interposer and the memory chip, a space between the memory chip and the logic chip, a space between the memory chip and the heat sink, and on an outer side surface of the memory chip; and
external terminals mounted on a lower surface of the package substrate.

* * * * *